United States Patent [19]
Cipolla et al.

[11] Patent Number: 5,266,520
[45] Date of Patent: Nov. 30, 1993

[54] ELECTRONIC PACKAGING WITH VARYING HEIGHT CONNECTORS

[75] Inventors: Thomas M. Cipolla, Hopewell Junction; Paul W. Coteus, Yorktown Heights; Robert H. Katyl; Robert J. Kelleher, both of Vestal; Paul A. Moskowitz, Yorktown Heights, all of N.Y.

[73] Assignee: International Business Machines Corporation, Armonk, N.Y.

[21] Appl. No.: 992,114

[22] Filed: Dec. 17, 1992

Related U.S. Application Data

[62] Division of Ser. No. 654,178, Feb. 11, 1991, Pat. No. 5,173,763.

[51] Int. Cl.⁵ .......................................... H01L 21/44
[52] U.S. Cl. ..................................... 437/183; 437/184; 437/209; 437/217; 437/220
[58] Field of Search ............... 437/209, 220, 183, 217, 437/184

[56] References Cited

U.S. PATENT DOCUMENTS

| | | | |
|---|---|---|---|
| 3,458,925 | 8/1969 | Napier et al. | 29/578 |
| 3,871,015 | 3/1975 | Lin et al. | 357/67 |
| 4,545,610 | 10/1985 | Lakritz et al. | 437/183 |
| 4,912,547 | 3/1990 | Bilowith et al. | 357/80 |
| 4,948,754 | 8/1990 | Kondo et al. | 437/183 |
| 4,999,700 | 3/1991 | Dunaway et al. | 357/70 |
| 5,039,628 | 8/1991 | Carey | 437/183 |
| 5,126,818 | 6/1992 | Takam et al. | 437/183 |

FOREIGN PATENT DOCUMENTS

| | | |
|---|---|---|
| 0218438 | 9/1985 | European Pat. Off. |
| 0380906 | 1/1989 | European Pat. Off. |
| 55-115339 | 9/1980 | Japan |
| 55-145360 | 11/1980 | Japan |
| 63-221635 | 9/1988 | Japan |
| 63-252453 | 10/1988 | Japan |
| 252272A | 12/1987 | Netherlands |
| 252471A | 12/1987 | Netherlands |
| 2228825 | 3/1989 | United Kingdom |

OTHER PUBLICATIONS

IBM Technical Disclosure Bulletin vol. 22 No. 7 Nov. 1979 pp. 2734–2735 "Double Mask System for Solder Bump Formation" by P. A. Totta.

IBM Technical Disclosure Bulletin vol. 20 No. 4 Sep. 1977 p. 1894 "Dummy Pads for Increased Creep Resistance" by Herdzk et al.

*Primary Examiner*—Brian E. Hearn
*Assistant Examiner*—Kevin M. Picardat
*Attorney, Agent, or Firm*—Daniel P. Morris; Alvin J. Riddles

[57] ABSTRACT

In joining conductors at different levels on a carrier to contact locations on a planar substrate, mound shaped connections are employed, with the height of each mound shaped connection extending to the level of the particular conductor to which it is bonded. The mound shaped connections are formed using planar processes of controlled volume deposition, surface tension shaping on reflow, and physical deformation. The height of the mound shaped connections are calculated empirically from the volume deposited bounded by the substrate pad after surface tension limits the slump on reflowing.

12 Claims, 4 Drawing Sheets

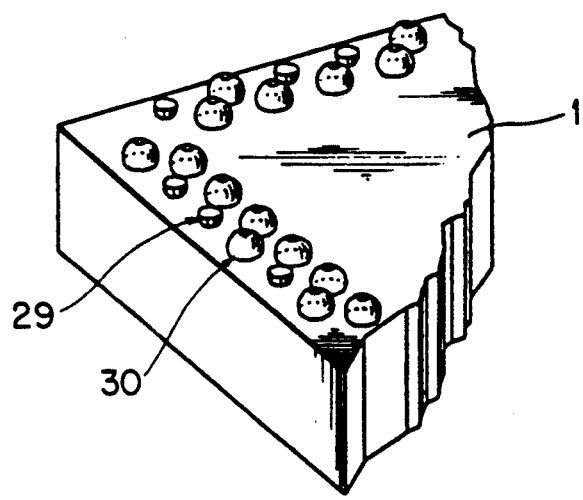
FIG.4
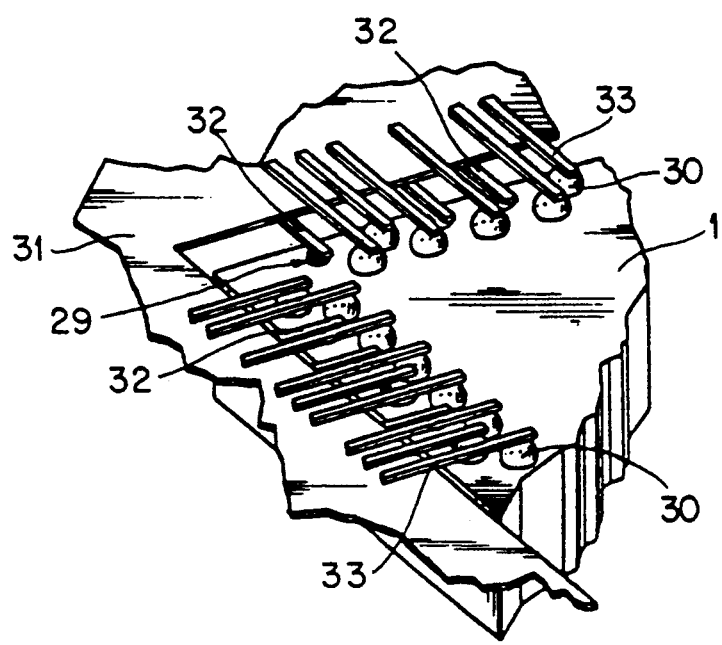
FIG.5
FIG.6
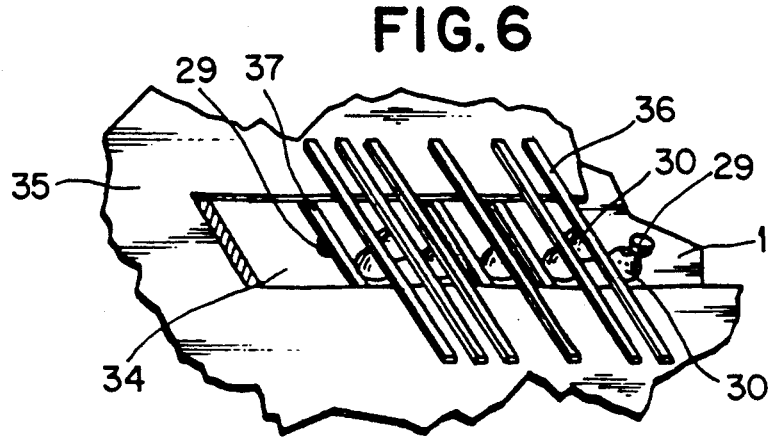

5,266,520

ELECTRONIC PACKAGING WITH VARYING HEIGHT CONNECTORS

This application is a divisional of application Ser. No. 07/654178 filed Feb. 11, 1991, now U.S. Pat. No. 5,173,763.

FIELD OF THE INVENTION

The invention relates to the connections in the packaging of electronic devices and in particular to the formation of connections between closely spaced conductor members on different levels and contact locations on a substrate surface.

BACKGROUND OF THE INVENTION

In the packaging of electronic devices, through a series of interfaces, conductors are progressively increased in spacing for ease and reliability in external connection. As dimensions become smaller, it becomes advantageous to be able to mount conductors on more than one level of a carrier and to be able to join them at an interface with corresponding connection locations on an essentially single level surface of a substrate. The substrate may be a semiconductor integrated circuit with connection locations on the surface thereof or a wiring module such as a buried conductor multilevel ceramic or dielectric laminate that provides further interconnection to device terminals. The carrier is generally a flexible dielectric film on which there is essentially a fan-out pattern of conductors with the closer spaced end of each conductor extending beyond an edge of the dielectric film for bonding to a location on the substrate.

With continued downsizing, as the art requires greater packing densities, conductors are being placed on both sides of the carrier film. This introduces a new problem in the fact that the conductor ends are at different levels with respect to the surface of the substrate. The problem has received some attention in the art. In Japanese 63-221635(A), conductors on different sides of carrier films are bent to a common level on a substrate. In Japanese 63-252453(A), small interconnecting wires are used in bonding connections from conductors at different levels on a carrier to closely spaced pads on the substrate surface. In Japanese 55-115339(A), the carrier has offset edges for conductor arrays that are at different levels and small interconnecting wires are used to go from the different levels to the pads on the substrate surface. The solutions heretofore in the art, however, require either a conductor shaping operation or the bonding of wire members which can result in fatigue or bonding failures.

SUMMARY OF THE INVENTION

The invention provides mound shaped connection locations on the substrate that extend above the substrate surface to the level of the conductor to which the location is to be bonded. The mound shaped connection structure formation on the substrate surface is achieved with processes that employ deposition of selected volume followed by surface tension controlled reflow and by deposition followed by physical deformation.

BRIEF DESCRIPTION OF THE DRAWINGS

FIG. 4 is a schematic view of the intermediate structure of FIG. 3 after a vertical deformation operation which forms a flat portion on the upper surface of the mound shaped connector locations.

FIG. 5 is a schematic view of the attachment of conductors of different heights extending cantilevered from the edge of a carrier to mound shaped connector locations of corresponding height.

FIG. 6 is a schematic view of the attachment of conductors of different heights extending unsupported across an aperture in a carrier to mound shaped connector locations of corresponding height.

Description of the Invention

At the interface where an array of conductors mounted on a carrier is bonded to connections on the surface of a substrate, the greater packing densities being developed in the art is requiring that the conductors on the carrier be mounted at more than one level, but when this takes place an accommodation is needed in bonding the conductors to connection locations on the planar surface of the substrate. Merely bending the conductor ends, employing interposing joining members or vias through the carrier, introduce reliability problems and added steps, and these problems and steps become increasingly burdensome as the density requirements result in carriers that involve more than single planar structures.

In accordance with the invention, a mound shaped connection is provided on the surface of the substrate at each contact location, that extends above the surface of the substrate a distance corresponding to the vertical separation between the substrate surface and the level of the carrier supported conductor to which it to be bonded. The structure of the invention provides mound shaped connections with the different heights to corresponding conductors that are fabricated with the precision of planar processing techniques.

Figure 1:
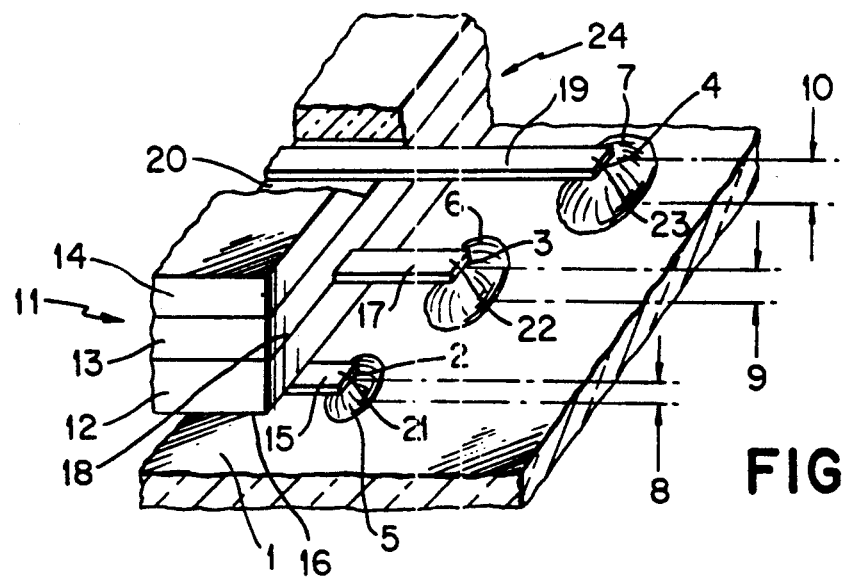
FIG. 1 is a schematic perspective view of different level conductors each bonded to a corresponding level, mound shaped connection, location.

Referring to FIG. 1, a perspective schematic of a carrier to substrate interface incorporating the invention is shown. In FIG. 1, on a planar substrate surface 1 which, as examples, may be a semiconductor integrated circuit device or a laminated intermediate wiring element, such as a multilevel ceramic wiring module, there are a plurality, shown as three, connection locations 2, 3 and 4, each with respectively, a mound shaped connector 5, 6 and 7, each in turn with a different height or thickness dimension 8, 9 and 10, respectively, corresponding to the particular vertical distance from the substrate surface 1 of the conductor to which the particular mound shaped connector is to be bonded. The conductors are shown in a laminated carrier 11 having an illustrative assembly of layers 12, 13 and 14 with conductor 15 extending cantilevered from the lower surface 16 of layer 12, conductor 17 extending, further cantilevered, from the upper surface 18 of layer 12 and conductor 19 extending still further cantilevered from the upper surface 20 of layer 13. Layer 14, illustrative of continued laminations is shown broken away to expose conductor 19. The ends 21, 22 and 23, respectively, of conductors 15, 17 and 19 are bonded to the respective mound shaped connectors 5, 6 and 7 in the plane of the conductor Thus, due to the constructed different height dimensions 8, 9 and 10, respectively, no bending is required of the conductors. The capability of the invention permits gang bonding to conductors of different height without bending which has heretofore not been achieved in the art.

There are several advantages of the invention that relate to the direction the art is taking. The carrier art, depicted by element 11, is progressing from having the conductors on a single side of a dielectric, such as a lead frame or tape, to conductors on different sides of multiple laminations, resulting in the dimensions from the conductor to the substrate and the dimension of the cantilever from the carrier to the connection location, or distance from an aperture edge to a connection location, having wide variation from one type of construction to another. Where the carrier merely provides an aperture rather than a common edge 24 for conductor cantilever, the ability to bend a conductor to accommodate the vertical dimension to the substrate becomes more difficult. The techniques employed in the art in fabricating the conductors have limits in precision that as spacing becomes more critical strongly motivate to the use of added levels of conductors.

In accordance with the invention, the highly developed precision of planar processing is employed to provide the mound shaped connections on the substrate with the capability that each can have a particular height corresponding to the particular conductor on the carrier to which it is to be bonded.

The planar processing in the invention employs mask location registration deposition of selected volumes of low temperature fusion contacting material that in connection with a reflow heat cycle results in a surface tension shaped mound with a height related to the particular deposited volume. In the deposition, the area of the wettable contact location pad in the substrate, the size of the opening employed in masking and the thickness of the deposition all are useable to produce the desired mound shaped connections following reflow. The mound shaped connection heights may be calculated in connection with the overall design The deposition and reflow operations are then followed, where specifications indicate desirability, by a flattening operation of the upper portion of the mound. The flattening operation is highly controllable and is oriented vertically with respect to the surface of the substrate. The flattening improves the contact of the conductor end and the mound in a bonding operation.

The processing of the invention is illustrated in connection with FIGS. 2 to 14 which show intermediate structures, height design considerations and conductor attachments for different structural variations and process procedures.

As an example, two levels of conductors on the carrier and two rows of contact locations on the substrate, such as are common in the Tape Automated Bonding techniques used in the art, are shown although it will be apparent to one skilled in the art in the light of the principles set forth that the invention can be extended to carriers with more levels and substrates with greater contact location complexity.

Figure 2:
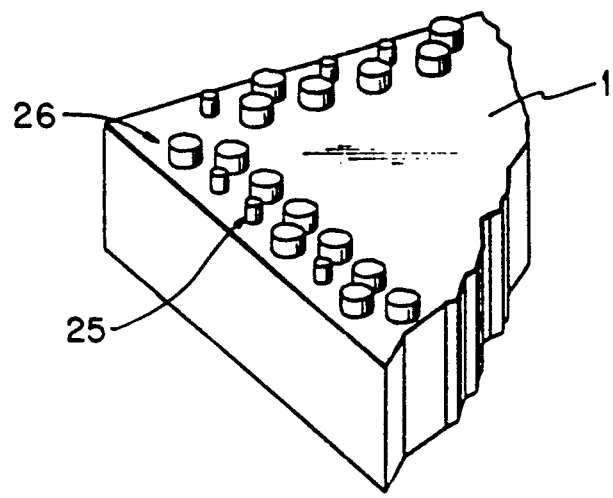
FIG. 2 is a schematic view of an intermediate structure where material in different volumes has been deposited for future connection locations.

Referring to FIG. 2, there is shown a schematic view of a substrate 1 in the intermediate processing stage where low temperature fusion material, such as solder, has been deposited in different volumes for particular contact locations in an exemplary two rows with staggered contact locations corresponding to the future location of rows of closely spaced contact locations that are closer and farther away from the substrate. The solder has, for example, been deposited through a mask with openings at the substrate contact locations and with different size openings for different height connection mounds, with, for example, the smaller size volumes 25 corresponding to the element 5 of FIG. 1 and the larger size volumes 26 corresponding to a higher final mound, such as the element 6 or 7 of FIG. 1.

Figure 3:
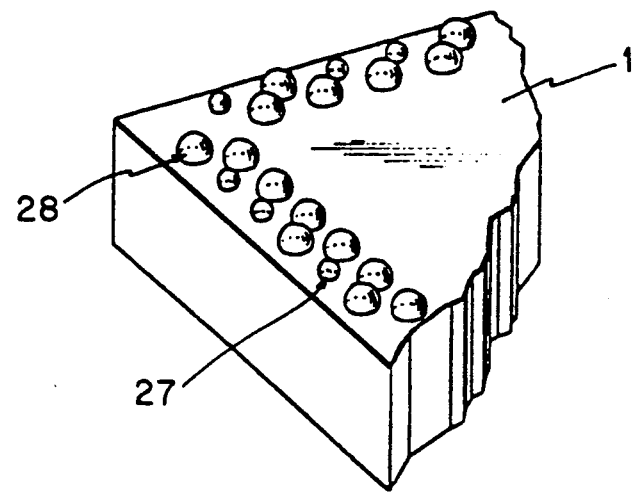
FIG. 3 is a schematic view of the intermediate structure of FIG. 2 after a heat cycle that causes the deposited connection locations to contract into mounds with different heights from the surface.

Referring next to FIG. 3, the volumes 25 and 26 are subjected to a heat cycle that renders the volume essentially molten which in turn permits surface tension to contract the shape into a mound 27 of smaller size and a mound 28 of a larger size.

The difference in height of the mounds 27 and 28 is selected in the overall design by a calculation employing the pad area, not shown, and the deposited volumetric dimensions correlated with the fact that upon reflow the wettable pad area will define the boundary of the volume and the deposited quantity within that boundary will produce the selected height.

For some overall specifications, the yield and reliability of the large number of ganged or simultaneously formed bonds is enhanced if the upper portion of the mound is essentially flat to the vicinity of the size of the end of the conductor to which it is to be bonded.

Referring to FIG. 4, the lower 29 and higher 30 mound types are flattened at the top. This may be accomplished by physical deformation using a specially shaped anvil that deforms the small top area of each mound or by techniques such as abrading and ion etching down to the level of a stepped mask, standard in the art. Alternatively, flattening may be obtained by reflowing the solder mounds while they are pressed against the surface of a non-wettable stepped die.

The bonding is illustrated in connection with FIGS. 5 and 6. In FIG. 5, the carrier 11 of FIG. 1 is a single lamination 31 having conductors 32 corresponding to element 15 of FIG. 1 on the underside of the carrier 31. The conductors 32 are bonded to the smaller mound shaped connectors 29. On the upper side of the carrier 31, the conductors 33, corresponding to element 17 of FIG. 1, are bonded to the larger mound shaped connectors 30. The bonds are all made to conductor ends that are not deformed and are in their unstressed condition.

Referring to FIG. 6, a schematic view is provided of the bonding where an aperture 34 is provided in the carrier 35, and the conductors 36 on the upper surface and 37 on the under surface, continue across the aperture 34 to other circuit locations not shown. In this type of construction, bending of the conductors would be an unavailable option and only through the fact that the invention provides the larger mounds 30 in contact with the upper surface conductors 36, and the smaller mounds 29 in contact with the under surface conductors 37, can reliable bonding be accomplished.

In accordance with the principles of the invention, the relative height of the different mound shaped connections is selected in correlation with the overall design and processing operations.

Figure 7:
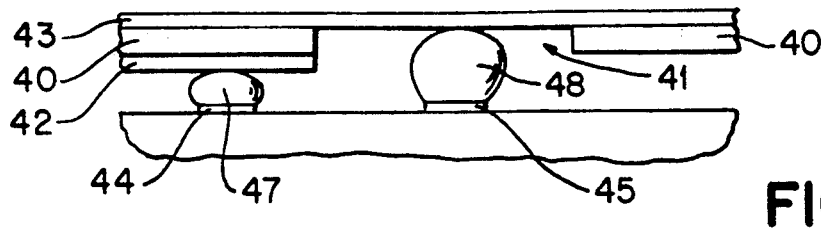
FIG. 7 is an illustrative structure requiring both precision in connection height and in the difference between connection heights.
Figure 8:
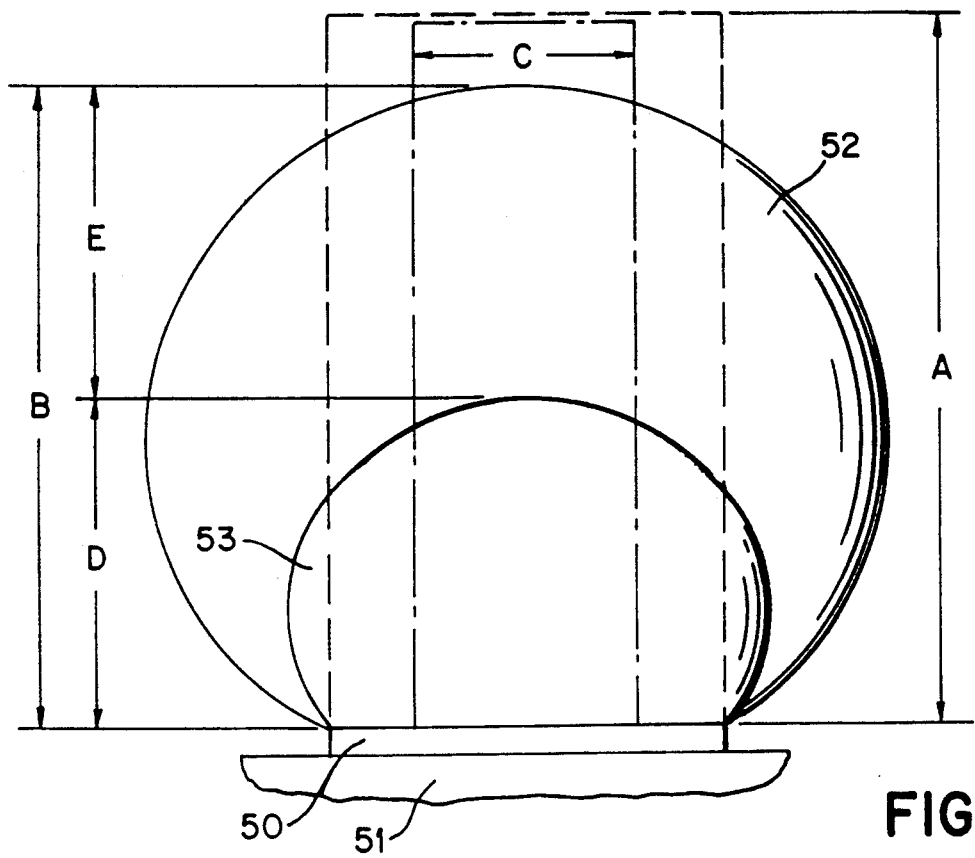
FIG. 8 is a schematic illustration of the considerations that enter connection height calculations where the pads are the same size.
Figure 9:
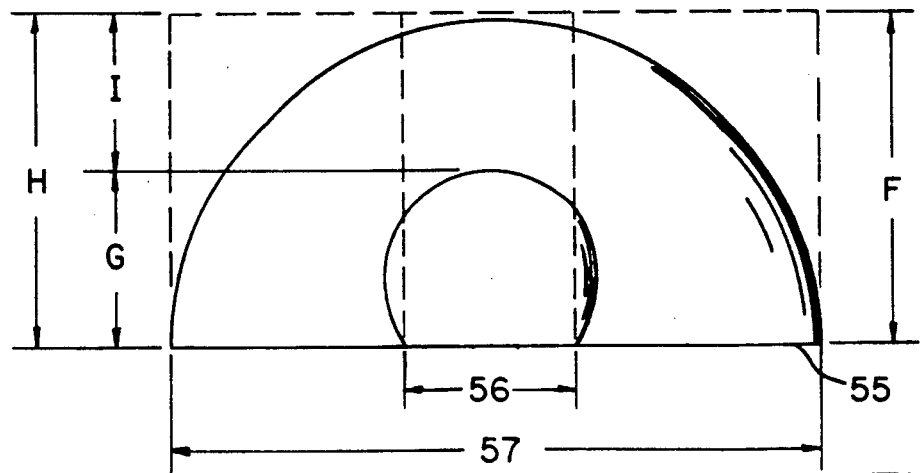
FIG. 9 is a schematic illustration of the considerations that enter connection height calculations where the pads are different sizes.

The selection of the mound shaped connection height is shown in connection with FIGS. 7, 8 and 9. FIG. 7 is an illustrative structure wherein precision in both the height and the differential between heights is of importance. FIG. 8 is a schematic illustration of the considerations that enter the height calculations where the volume depositions are on the same size pad. FIG. 9 is a schematic illustration of the considerations that enter the height calculations where the volume depositions are on different size pads.

In FIG. 7 the structure has a conductor carrier 40 with an aperture 41. The carrier 40 supports a conductor 42 on one side and another conductor 43 on the other side. In the overall design, contact locations 44 and 45 on the plane surface of a substrate 46 have mound shaped connections 47 and 48 to conductors 42 and 43, respectively. Connection 47 requires one height from the plane surface of substrate 44 to the conductor 42. Connector 48 has a greater height from the plane surface of substrate 44 through the aperture 41 to the conductor 43. The differential between the two heights is the thickness of the carrier 40 which, as an example, may be 2.0 mils, and the conductor 42 which may be 1.0 mil for a total of 3.0 mils.

At the present state of the art, there are conductors and conductive areas that perform different functions, such as ground planes, signal carrying and power carrying with different proximity requirements with respect to other elements in the electronic package. Where, as illustrated, cantilevering is not employed, flexibility on contact height and height differential is reduced.

In accordance with the invention, the mound shaped connection height is calculated in connection with the overall design so that hole size and mask thickness values can be used.

The height of the mound shaped connection is determined by the shape taken by the deposited volume after that volume has been subjected to a reflow heat cycle that permits surface tension to reduce the various deposited increments into a ball. The ball boundary at the substrate is defined by the pad.

In calculating, we will need the formula for the volume of a cylinder of height h and radius r which is $$V = \pi r_b^2 h \qquad \text{Eq. 1}$$

Also needed is the formula for the volume of a sphere of height $h_a$, which has been truncated at the bottom to a circle of radius r and at the top to a circle of radius $r_t$, which is $$V = \pi/6 h_a (h_a^2 + 3r_b^2 + 3r_t^2) \qquad \text{Eq. 2}$$

The connection height is an empirical function of the deposited volume which in turn is made up of the boundary area times the height of the deposit(s) as the deposited volume slumps in reflow when surface tension produces the smallest ball the pad size determined boundary area will permit. The final shape will be a sphere, truncated at the bottom.

The differential height is the smaller height subtracted from the larger height.

Referring to FIG. 8, a schematic illustration is provided of the considerations involved in the calculation where the pad sizes are the same. In FIG. 8, all the pads such as 50 on the plane surface of a substrate 51 have the same certain wettable area, for example, $\pi r^2$ if round. As an illustration, through a mask shown in dotted outline, with a thickness shown as A, a deposition of a reflowable contact material, such as solder, is provided. The thickness A of the mask is selected so that when filled the volume included in the area of the pad 50 times the A dimension is the volume of the ball 52 after reflow which establishes the higher mound shaped connection height B required for connection 48 in the illustration of FIG. 7.

Simultaneously with the above deposition of the larger solder volume, a smaller diameter hole in the mask defines the deposition of a smaller diameter solder column C outlined by dot-dash (.-) lines. The diameter of this column is chosen so that its volume is equal to the volume of ball 53 after reflow, which establishes the lower mound shape connection height D required for connection 47 of FIG. 7. The differential between the B and D height dimensions is labelled E. For a pad diameter of 6 mils and a mask thickness A of 5 mils and a smaller hole diameter C of 3 mils after reflow of Pb-Sn solder, height B was 5 mils, height D was 2 mils, giving a differential E of 3 mils.

Referring next to FIG. 9, a schematic illustration is provided of the considerations involved in the calculation where the pad sizes are different. An advantage of this situation is that a single mask can be used to define both the pad and the solder depositions. A limitation, however, is that a significant height difference may require a large pad area.

In FIG. 9, the two pad sizes are shown schematically superimposed on the substrate surface 55 with the smaller pad size labelled 56 and the larger pad size labelled 57. A single mask is employed, shown dotted, with two sizes of holes, one for each connection height. The mask thickness is shown as dimension F. The evaporated reflowable material, upon reflowing, slumps to the ball 58 for the larger pad 57 and to the ball 59 for the smaller pad 56 with the respective heights shown as G and H, with the differential shown as I. For a pad 56 diameter of 4 mils and a pad 57 diameter of 14 mils and a mask thickness F deposited layer of 5 mils; the reflowed height H was 7 mils, the height G was 4 mils and the differential height was 3 mils.

It will be apparent to one in the art that there will be wide variations in possible fabrication techniques using different pad sizes, mask thicknesses, hole sizes and number of depositions, and that the flattening operation described in connection with FIG. 4, where desirable, would be conducted after reflowing with any material loss therefrom included in the height calculation.

Best Mode of Carrying Out the Invention

As specifications become tighter, it is advantageous to have the connections not constrain the current carrying capacity. The contact locations on the substrate have an area that is usually carefully designed. This is especially the situation where the substrate is a semiconductor integrated circuit. The structures and processes illustrated in connection with FIGS. 10-14 provide a technique of providing the mound shaped connections that do not reduce the designed current carrying capability of the contact locations in the substrate.

Figure 10:
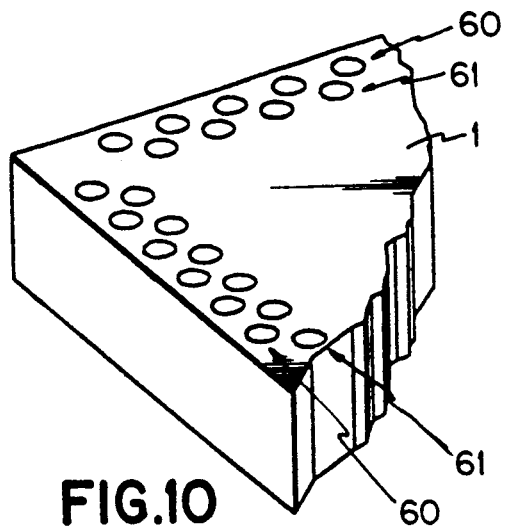
FIG. 10 is a schematic view of a substrate on which has been deposited at a plurality of connector locations a first level of connector metallurgy.

Referring to FIG. 10, a schematic view is provided of a substrate 1 on which two rows 60 and 61 of contact locations have been formed around the periphery. The contact locations have a designed current carrying capacity area and usually are defined, by deposition through a mask with the precise area openings, layers of the contact metallurgy for the particular application, for example, chromium, copper and gold in the case of a semiconductor device substrate.

Figure 11:
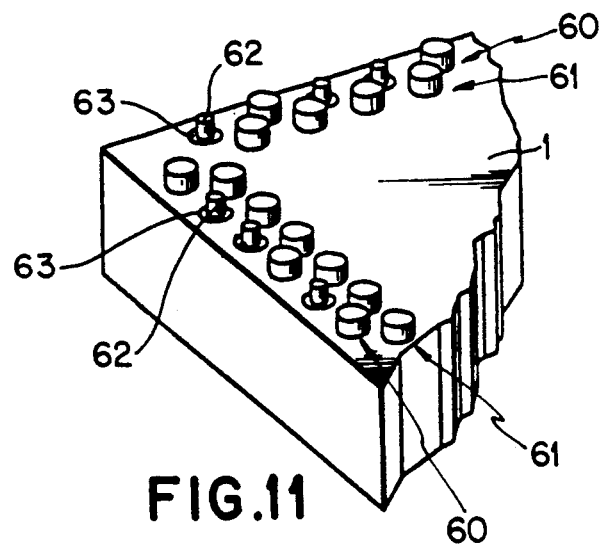
FIG. 11 is a schematic view of the substrate of FIG. 10 on which has been deposited on the connection locations a second level of different area metallurgy.

Referring next to FIG. 11, a mask is employed that has openings in registration with the contact locations in rows 60 and 61 with the same size opening being used for the locations that are to receive the higher mound shaped connections row 61 and a smaller opening being used for the locations in row 60 that are to be the lower mound shaped connections. The thickness of the mask in relation to the area of the opening provides the control of the volume of solder deposited. In FIG. 11, the smaller openings in row 60 provide contact volumes 62 that are smaller in diameter than the diameter 63 of the designed contact locations. It should be noted that both steps, the contact metallurgy and the solder deposition, may be carried out with the same mask for the process illustrated in FIG. 9.

Figure 12:
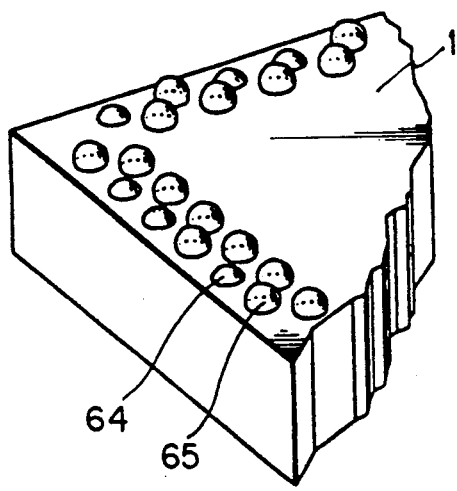
FIG. 12 is a schematic view of the substrate of FIG. 11 after a heat cycle which causes the connection locations to contract into mounds with different heights with the same contact area on the substrate surface.

The deposited solder is next subjected to a reflow heat cycle which causes the deposited solder to form a mound, as illustrated in FIG. 12, where all mound shaped contacts have their contact area with the substrate determined by the designed contact area while the difference in deposited volumes results in a difference in height between the small volume 62 contacts 64 and the larger volume contacts 65.

Where deemed beneficial, the mound shaped contacts of FIG. 12 can then be subjected to a flattening operation as described in connection with FIG. 4.

Figure 13:
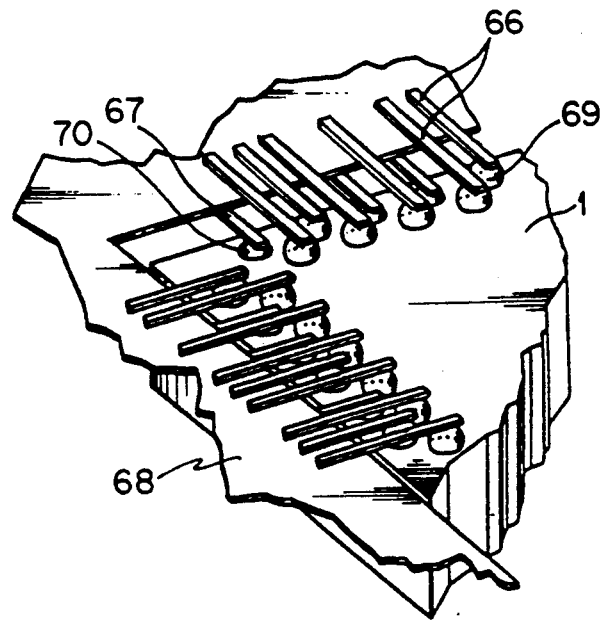
FIG. 13 is a schematic view of the attachment of conductors of different heights extending cantilevered from the edge of a carrier to mound shaped connector locations of corresponding height that have the same contact area on the substrate surface.

In FIG. 13, the conductors 66 on the upper side and 67 on the underside of the carrier 68 are respectively bonded to the higher mound contacts 69 and the lower mound contacts 70.

Figure 14:
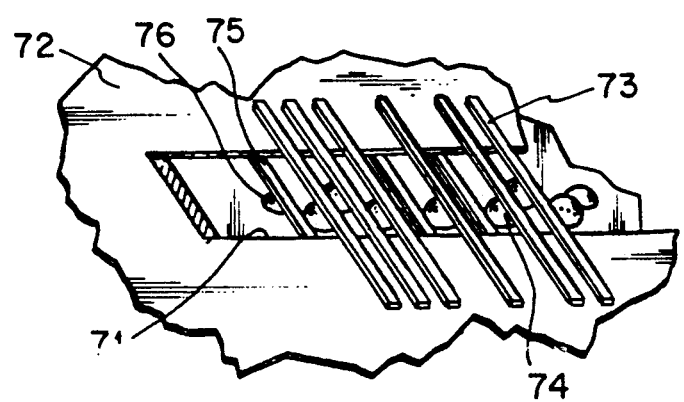
FIG. 14 is a schematic view of the attachment of conductors of different heights extending across an aperture in a carrier to mound shaped connector locations of corresponding height that have the same contact area on the substrate surface.

Similarly, in FIG. 14, involving an aperture 71 in the carrier 72, the conductors 73 on the upper side of the carrier 72 are bonded to the higher mound shaped contacts 74 and the conductors 75 on the underside of the carrier 72 are bonded to the lower height mound shaped contacts 76.

What has been described is the structure and process of providing an interface between a carrier having conductors at more than one level and a planar substrate wherein the planar substrate is provided with mound shaped contacting members that have a height that corresponds to the height from the planar surface to the level of the conductor to which it is to be bonded.

Having thus described our invention, what we claim as new and desire to secure by Letters Patent is:

1. The process of fabricating electrical connections of different thicknesses above a planar substrate surface at electrical connection locations in said planar substrate surface comprising the steps of:
   depositing a different controlled volume of low temperature fusible connecting material at each said different thickness requiring location, and
   reflowing said deposited volumes of fusible material.

2. The process of claim 1 wherein each said controlled volume is produced through the step of depositing on a particular said electrical contact location in said planar substrate through different mask hole sizes.

3. The process of claim 1 wherein the thickness of a particular electrical connection is established by the height of said controlled volume after a slump limited by surface tension of said fusible material and the boundary of the particular connection location in said planar substrate surface during said reflowing step.

4. The process of claim 3 including the additional step of flattening to a conductor contacting size a portion of said deposited and reflowed volumes of connecting material.

5. The process of claim 4 wherein said deposition of said connecting material is conducted on a designed current carrying area of metallurgy.

6. The process of claim 5 including the additional step of flattening to a conductor contacting size a portion of said deposited and reflowed volumes of connecting material.

7. In a process of fabricating electrical connections on connection pads in the surface of an electronic packaging substrate, an improvement for producing a raised connection that extends a selected thickness above said substrate, comprising the steps of:
   providing deposition controlling masking, said masking including therein an opening therethrough for each connection pad on said substrate receive a raised connections,
   said masking further including a dimension relationship between the area of each said opening and said masking thickness that defines a controlled volume,
   positioning said masking in contact with said substrate with each said opening in registration over a pad in said substrate,
   depositing a low temperature fusible connecting material into each said opening in said masking in said controlled volume,
   removing said masking, and,
   reflowing said deposited connecting material, whereby aid controlled volume of said connecting material slumps into a surface tension shape covering the area of said pad and extending a thickness above said pad in said substrate surface determined by said controlled volume.

8. The process of claim 7 including the additional step of flattening said slumped surface tension shape into a conductor contacting area parallel to said pad.

9. The process of claim 7 wherein said masking includes a separate mask for each different thickness to which connections are to be raised.

10. The process of claim 7 wherein said masking includes a single mask with a different opening area for each different thickness to which connections are to be raised.

11. The process of claim 9 including the additional steps of flattening said slumped surface tension shape into a conductor contacting area parallel to said pad for each different connection thickness.

12. The process of claim 10 including the additional steps of flattening said slumped surface tension shape into a conductor contacting area parallel to said pad for each different connection thickness.

* * * * *